(12) United States Patent
Kreklow et al.

(10) Patent No.: US 12,431,671 B2
(45) Date of Patent: Sep. 30, 2025

(54) ELECTRICAL PLUG CONNECTOR

(71) Applicant: Turck Holding GmbH, Halver (DE)

(72) Inventors: Kevin Kreklow, Freiburg (DE); Hermann Schwagmann, Detmold (DE)

(73) Assignee: Turck Holding GmbH, Halver (DE)

( * ) Notice: Subject to any disclaimer, the term of this patent is extended or adjusted under 35 U.S.C. 154(b) by 262 days.

(21) Appl. No.: 18/012,452

(22) PCT Filed: Jun. 17, 2021

(86) PCT No.: PCT/EP2021/066438
§ 371 (c)(1),
(2) Date: Dec. 22, 2022

(87) PCT Pub. No.: WO2022/002615
PCT Pub. Date: Jan. 6, 2022

(65) Prior Publication Data
US 2023/0268695 A1   Aug. 24, 2023

(30) Foreign Application Priority Data

Jun. 29, 2020 (DE) .................. 10 2020 117 030.0

(51) Int. Cl.
*H01R 13/66* (2006.01)
(52) U.S. Cl.
CPC ..... *H01R 13/6683* (2013.01); *H01R 13/6675* (2013.01); *H01R 13/6691* (2013.01)
(58) Field of Classification Search
CPC ............ H01R 13/6683; H01R 13/6675; H01R 13/6691

USPC .................................................... 439/620.22
See application file for complete search history.

(56) References Cited

U.S. PATENT DOCUMENTS

| | | | |
|---|---|---|---|
| 5,989,069 A | 11/1999 | Tan | |
| 6,131,947 A * | 10/2000 | Mramor | H01R 13/6683 |
| | | | 307/10.1 |
| 9,496,668 B1 * | 11/2016 | Baker | H01R 13/717 |
| 10,191,088 B2 * | 1/2019 | King | H02J 7/34 |
| 10,673,179 B1 * | 6/2020 | Harris | H01R 13/6691 |
| 2004/0180579 A1 * | 9/2004 | Glasson | H01R 31/065 |
| | | | 439/607.47 |
| 2011/0130034 A1 | 6/2011 | Montena et al. | |
| 2016/0343232 A1 | 11/2016 | Itzler et al. | |
| 2019/0160900 A1 * | 5/2019 | Gonzalez Juanes | |
| | | | H01R 13/6691 |

FOREIGN PATENT DOCUMENTS

| | | |
|---|---|---|
| DE | 202007018306 | 6/2008 |
| DE | 202007018307 | 7/2008 |
| DE | 102014003672 | 6/2015 |

(Continued)

*Primary Examiner* — Gary F Paumen
(74) *Attorney, Agent, or Firm* — Volpe Koenig

(57) ABSTRACT

An electrical plug connector (10) having contacts (30) on the input side and a housing (20), within which electrical lines (40) and an electrical switch with at least one sensor device (84) and a control device (82) are connected to the contacts (30). The sensor device (84) and the control device (82) are arranged on a common carrier body (70). The carrier body is formed as a circuit carrier, which is made from plastic by injection-molding, on which metallic conductor tracks (80) are applied. This allows simple integration of sensor and monitoring tasks into conventional plug connectors.

15 Claims, 1 Drawing Sheet

(56) References Cited

FOREIGN PATENT DOCUMENTS

| | | |
|---|---|---|
| DE | 102014115122 | 4/2016 |
| DE | 202016008404 | 12/2017 |
| DE | 102017107251 | 10/2018 |
| EP | 1923965 | 5/2008 |
| WO | 9809486 | 3/1998 |
| WO | 2018222695 | 12/2018 |
| WO | 20200026057 | 2/2020 |

* cited by examiner

ELECTRICAL PLUG CONNECTOR

TECHNICAL FIELD

The invention relates to an electrical plug connector having contacts on the input side and a housing, within which electrical lines and an electrical circuit with at least one sensor device and a control device are connected to the contacts.

BACKGROUND

Electrical plug connectors have long been known and are used in many different ways. The plug connector can, for example, be formed as a plug, a socket or a coupling. The plug connector may, for example, be attached to the end of a cable or, in another design, have one end connected to a printed circuit board. The present invention covers all types of such plug connectors in a wide variety of forms.

Simply constructed plug connectors generally consist of contacts on the input side and a housing inside which electrical lines are connected to the contacts. For example, a cable of which the individual lines are electrically connected to the contacts in the housing of the plug connector can be connected to the mating connector in a simple manner. The plug connectors are plugged, screwed or detachably fastened in a similar way onto the mating connector.

In the meantime, plug connectors have also become known that not only contain electrical lines within their housing that are connected to the contacts of the plug connector, but are also designed to be "smart". For this purpose, an electrical circuit is arranged within the housing of the electrical plug connector and, for example, takes on monitoring and sensor functions in order to ensure the proper functioning of the plug connector as well as of the signals transmitted via these plug connectors. For this purpose, the electrical circuit also has a control device in addition to the sensor device. The control device ensures that, on the one hand, the parameters of the plug connector or of the signals within the plug connector that are to be monitored are analyzed and, on the other hand, are transmitted in a suitable manner, either wirelessly or via contact, to an evaluation device located outside the plug connector.

Examples of such "smart" plug connectors are disclosed in DE 10 2017 107 251 A1, U.S. Pat. No. 5,989,069, US 2016/0343232 A1, and WO 2018/222695 A1.

In these known "smart" plug connectors, an ordinary, i.e. a plate-shaped, printed circuit board on which an electrical circuit with control device is mounted is regularly arranged inside the housing of the plug connector. In this case, as shown for example in WO 2018/222695 A1, the sensor device is not located on the associated printed circuit board on which the control device sits. Simple assembly of such a "smart" plug connector is therefore not possible. Another complicating factor is that the carrier body to be inserted into the housing of the electrical plug connector must accommodate, in addition to the printed circuit board and the sensors, a large number of other circuit components. These include, in addition to the individual plug connector contacts, so-called contact cores and transformer coils. All of these components must be inserted into the carrier body, fastened there, and then closed with a separate cover. Finally, this carrier body equipped with the individual components and closed with a lid must then be inserted into the housing of the plug connector.

SUMMARY

The object of the present invention is to provide a "smart" electrical plug connector which consists of few parts and is consequently easy to handle and, in particular, easy to assemble.

This object is achieved by a plug connector having one or more of the features disclosed herein.

Developments of such a plug connector are described below and in the claims.

The electrical plug connector according to the invention is thus distinguished in particular by the fact that the electrical plug connector has contacts on the input side and a housing within which electrical lines and an electrical circuit with at least one sensor device and a control device are connected to the contacts. In this case, the sensor device and the control device are arranged on a common, one-piece carrier body. According to the invention, the carrier body is formed as a circuit carrier made of a non-metal material and deviating from a plate shape. Metal conductor tracks are applied to the carrier body.

The essential core in the present plug connector lies in a particular design of the carrier body, which is to be inserted into the housing of the electrical plug connector according to the invention.

This carrier body is preferably made of plastic, although the carrier body can also be made of another electrically non-conductive material, such as ceramic or glass, and is manufactured in one piece, for example as an injection-molded part, sintered part or 3D-printed part. In this case, this carrier body deviates from a conventional plate shape, i.e. a merely flat design, for example in that the carrier body, facing the input-side contacts of the plug connector, has an outer contour that is adapted to the inner contour of the housing of the plug connector. Metal conductor tracks are applied to the carrier body formed in this way for contacting the electrical circuit. In addition to these electrical conductor tracks, in accordance with the invention the carrier body also carries the electrical circuit with the sensor device and a suitable control device.

For the assembly of such a plug connector, it is simply necessary to insert the carrier body, which is formed as a circuit carrier, into the housing of the electrical plug connector and to connect the electrical lines to the input-side contacts of the plug connector.

In a development of the invention it is provided that the housing of the plug connector completely surrounds the carrier body.

In another development, it is provided that the housing is formed in one part or two parts with a first housing part and a second housing part. In the case of a so-called round plug to be realized, the housing of the electrical plug connector is provided with a cylindrical outer shape and is formed in particular as an M8 or M12 round housing. Other M variants are of course also possible.

According to the present invention, the carrier body can have suitable fastening means with which the carrier body is fastened directly in the housing of the plug connector. For example, screw threads can be provided for this purpose on the carrier body and on the housing of the plug connector. For this purpose, the carrier body suitably has on its outer side an external thread which can be screwed into a matching internal thread machined on the inner circumference of the housing of the plug connector. In addition to these screw fastenings, clamp fastenings, snap-action fastenings and also adhesive connections can also be provided to fasten the carrier body inside the housing of the plug connector.

In another development of the invention, the carrier body formed in one piece comprises a plurality of portions integrally attached to one another, at least one, preferably two outer portions and a second portion bonded to at least one of the outer portions. This second portion is plate-shaped and carries the necessary circuit components of the electrical circuit. On the other hand, the outer portion or the two outer portions attached to this plate-shaped portion are formed in such a way that they adapt to the inner contour of the housing of the plug connector at least to a large extent in order to be fastened there in a simple manner. The screw connections mentioned above are suitable for this purpose, for example.

In another development of the invention, it is provided that the sensor device is not arranged on the plate-shaped portion of the carrier body, but in a region of the carrier body which extends as close as possible to the housing wall of the plug connector. This ensures that the sensor device can determine the ambient condition (e.g. temperature, humidity or pressure, etc.) directly present at the outer wall of the plug connector. It is expedient to place an opening in the housing of the plug connector corresponding to the arrangement of the sensor device.

The electrical circuit of the plug connector according to the invention, together with the sensor device, is intended to monitor various operating conditions of the plug connector or of the signals passed through the plug connector, or the like. For this purpose, it is necessary that the electrical circuit also includes a communication device with which the detected parameters can be transmitted to an evaluation device outside the plug connector. For this purpose, the electrical circuit of the plug connector has a suitable communication device, e.g. a Bluetooth connection or a mobile radio connection. The transmitted signals can then be received and evaluated by a suitable receiver device.

For a power supply to the electrical circuit within the electrical plug connector housing, it is expedient to connect the electrical circuit electrically to the input-side contacts of the plug connector, since electrical signals are transmitted there which are utilized for the power supply for the electrical circuit within the plug connector. For this purpose, electrically conductive spring elements, in particular solderable spring elements, can be provided on the carrier body and are connected to the contacts and/or electrical lines of the plug connector. Furthermore, it can be advantageous to provide a voltage regulation device within the plug connector housing in order to be able to supply the electrical circuit with supply voltage in a regulated manner.

BRIEF DESCRIPTION OF THE DRAWINGS

The plug connector according to the present invention will be explained in greater detail with reference to an exemplary embodiment in conjunction with three figures to follow, in which.

DETAILED DESCRIPTION

In the following Figures, like reference signs denote like parts with the same meaning, unless otherwise indicated.

Figure 1:
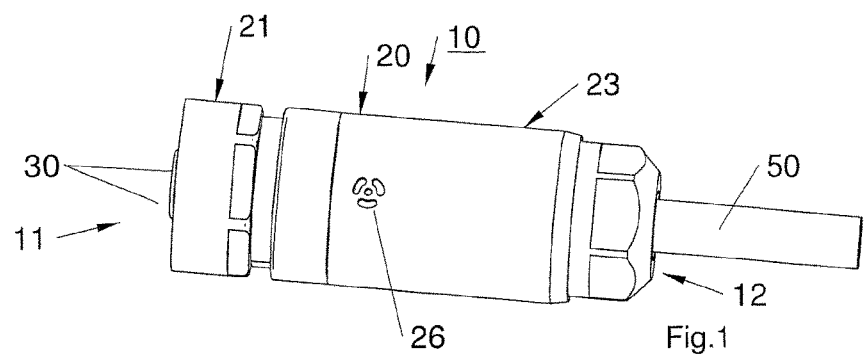
FIG. 1 shows the exterior view of an electrical plug connector according to the present invention.

FIG. 1 shows an exemplary embodiment of an electrical plug connector in side plan view. The plug connector is formed as an electrical round plug. The plug connector is marked with the reference sign 10 and has a front plug-in side 11 and a rear side 12 facing away therefrom. The plug connector 10 has a cylindrical housing 20 with a first housing part 21 facing the plug-in side 11 and a second housing part 23 longer than the first. The two housing parts 21 and 22 can be provided, for example, by means of a screw connection with an internal thread 22 indicated in FIG. 3 and an external thread on the housing part 23 not shown in the Figures. The housing 20, in this case the second housing part 23, has an opening on its wall, the significance of which will be discussed below.

Contacts 30 protrude from the plug-in side 11 and form the plug-in contacts of the plug connector 10. These contacts 30 are electrically connected inside the housing 20 of the plug connector 10 at contact tabs 32 and via electrical lines 40 to a cable 50 projecting from the rear side 12 of the plug connector 10. For this purpose, for example, electrical lines 40 of the cable 50 can be connected to the contact tabs 32 inside the housing 20 by means of crimp connections, screw connections, solder connections or the like. The contact tabs 32 are electrically conductively connected to the contacts 30.

Figure 2:
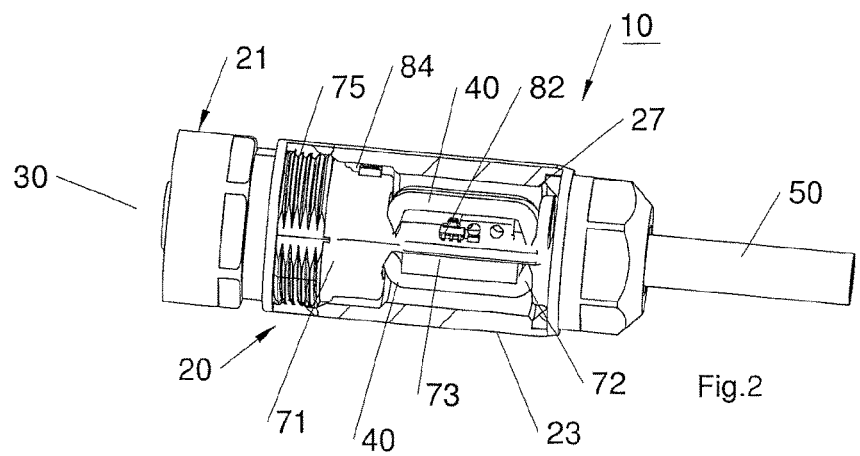
FIG. 2 shows the electrical plug connector of FIG. 1 in partial broken view.
Figure 3:
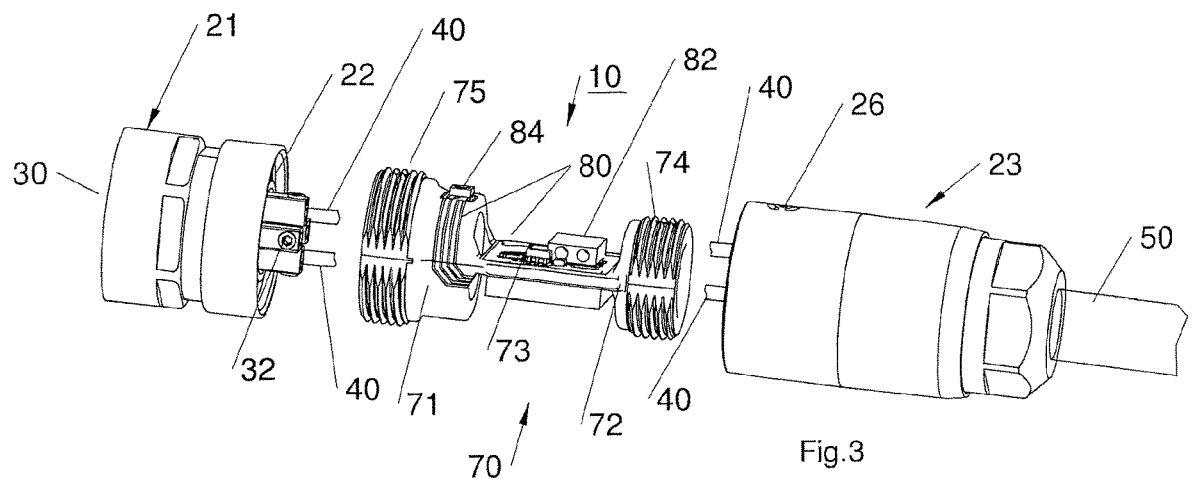
FIG. 3 shows an exploded view of the plug connector in FIGS. 1 and 2.

As shown in particular in the sectional view of FIG. 2 and the perspective view of FIG. 3, a specially formed carrier body 70 is located inside the housing 20 of the plug connector 10. This carrier body 70 consists of an electrically non-conductive material, preferably plastic, and is manufactured by means of injection molding or 3D printing. The carrier body 70 is thus electrically non-conductive. In the illustrated exemplary embodiment, the carrier body 70 has three portions 71, 72 and 73 joined together in one piece. The middle portion 73 has a plate-like form for receiving electrical circuit components of an electrical circuit. The individual circuit components are generally designated by the reference sign 82 for a control device. Adjacent to this middle portion 73 of the carrier body 70, in the illustration of FIGS. 2 and 3, is a first portion 71 of the carrier body on the left and a second portion 72 of the carrier body 70 on the right. The plate-shaped portion of the carrier body 70 is referred to as the third portion 73. The carrier body 70 is provided with electrical lines 80 in its third portion 73 and partially also in its first portion 71. These electrical lines 80 can be applied as metallizations to the carrier body 70 using a suitable deposition technique after the carrier body 70 has been produced. Instead of depositing the metallization to form the electrical lines 80, it is also possible to use electrical conductive paste to place the required electrical lines 80 on the carrier body 70.

As can be seen particularly clearly in FIG. 3, the first portion 71 and the second portion 72 of the carrier body 70 are adapted to the inner contour of the housing 20 of the plug connector in that the first portion 71 and the third portion 73 are preferably cylindrical and hollow-cylindrical, respectively, and correspond approximately to the inner diameter of the round housing 20 of the plug connector 10. External threads 75, 74 are integrally molded on this cylindrically formed first portion 71 and third portion 73 respectively so that the carrier body 70 together with the electrical circuit can be screwed into the housing 20 of the plug connector 10 in a simple manner, so that a good mechanical connection between the housing 20 and the carrier body 70 is ensured.

However, the outer contour of the carrier body 70 is not limited to the embodiment shown. Rather, the outer contour of the entire carrier body 70 may also be angular, oval or the like, depending on the requirements of the inner contour of the housing 20. It is merely essential that the at least one of the outer portions 71, 72 of the carrier body 70 is adapted to the housing 20 of the plug connector 10.

The electrical circuit applied to the carrier body 70 is intended to detect a wide variety of parameters of the plug connector, the currents flowing therein, and the ambient conditions. For this purpose, the electrical circuit has a control device 82 which is electrically connected to a suitable sensor device 84. The electrical sensor device 84, which may be a temperature sensor, for example, is not placed on the plate-shaped second portion 72 of the carrier body 70, but on a recess of the cylindrical portion 71, as can be clearly seen in FIG. 3. The sensor device 84 is thus placed close to the housing wall of the housing 20. In order for the sensor device 84 to optimally sense the ambient conditions of the plug connector 10, for example the temperature or humidity or the like, the housing 20 has the aforementioned opening 26, below which the sensor device 84 is placed. The sensor device 84 is in electrical communication with the electrical circuit arrangement or the electrical control device 82 via the electrical lines 80 applied to the first portion 21.

The power supply for the entire electrical circuit on the carrier body 70 is provided by suitable electrical connections or electrical supply lines, not shown in the Figures, which are electrically connected to the contacts 30 or contact tabs 32. For this purpose, for example, solderable spring contacts may be provided which, when the carrier body 70 is assembled into the housing 20 of the plug connector 10, resiliently contact the contact tabs 32 and provide a voltage tap there. In order to compensate for voltage fluctuations, the electrical circuit preferably has a voltage regulation device.

Finally, for the sake of completeness, it should be noted that the cable 50 comprises individual electrical lines 40 connected to the contact tabs 32 inside the housing 20 of the plug connector 10.

LIST OF REFERENCE SIGNS 10 plug connector
11 plug-in side
12 rear side
20 housing
21 first housing part
22 internal thread
23 second housing part
26 opening
27 sealing ring
30 contacts
32 contact tabs
40 electrical line
50 cable
70 carrier body
71 first portion of the carrier body
72 second portion of the carrier body
73 third portion of the carrier body
74 external thread
75 external thread
80 electrical lines
82 control device
84 sensor device

The invention claimed is:

1. An electrical plug connector (10), comprising:
a housing (20);
contacts (30) on an input side;
electrical lines (40) and an electrical circuit with at least one sensor device (84) and a control device (82) are connected to the contacts (30) within the housing (20);
a common, one-piece carrier body (70) on which the sensor device (84) and the control device (82) are arranged; and
the carrier body (70) is formed as a circuit carrier made of a non-metal material and deviating from a plate shape, to which metal conductor tracks (80) are applied;
wherein the carrier body (70) includes a fastener with which the carrier body (70) is fastened directly to the housing (20), and the fastener of the carrier body (70) comprises screw threads which are arranged at least in portions on an outer side of the carrier body (70) and are screwable into an internal thread of the housing (20).

2. The electrical plug connector (10) as claimed in claim 1, wherein the carrier body (70) is formed as an injection-molded part, as a 3D-printed part, or as a sintered part.

3. The electrical plug connector (10) as claimed in claim 2, the carrier body (70), facing the contacts (30) on the input side, has an outer contour that is at least approximately adapted to an inner contour of the housing (20).

4. The electrical plug connector (10) as claimed in claim 1, wherein the housing (20) completely surrounds the carrier body (70).

5. The electrical plug connector (10) as claimed in claim 1, wherein the housing (20) is formed in one part or is formed in two parts with a first housing part (21) and a second housing part (23).

6. The electrical plug connector as claimed in claim 1, wherein the housing (20) has a cylindrical outer shape.

7. The electrical plug connector as claimed in claim 1, wherein the carrier body (70) consists substantially of two outer portions and a middle portion (71, 72, 73) integrally attached to one another, wherein the two outer portions (71, 72) are substantially hollow-cylindrical and are connected to the middle portion (73) which is plate-shaped.

8. The electrical plug connector as claimed in claim 7, wherein the control device (82) of the electric circuit is arranged on the middle plate-shaped portion (73).

9. The electrical plug connector as claimed in claim 7, wherein the sensor device (84) is arranged on an outer wall of a first one of the hollow-cylindrical portions (71) of the carrier body (70).

10. The electrical plug connector as claimed in claim 7, wherein an external thread is integrally machined on each of the two outer portions (74, 75) of the carrier body (70).

11. The electrical plug connector as claimed in claim 1, wherein the electrical circuit comprises a wireless or wired communication device.

12. The electrical plug connector as claimed in claim 1, wherein the electrical circuit is connected to the electrical lines (40) via electrically conductive connections.

13. The electrical plug connector as claimed in claim 1, wherein the electrical circuit comprises a voltage regulation device.

14. The electrical plug connector as claimed in claim 6, wherein the housing is formed as an M8 or M12 round housing.

15. An electrical plug connector (10), comprising:
a housing (20);
contacts (30) on an input side;
electrical lines (40) and an electrical circuit with at least one sensor device (84) and a control device (82) are connected to the contacts (30) within the housing (20);
a common, one-piece carrier body (70) on which the sensor device (84) and the control device (82) are arranged; and the carrier body (70) is formed as a circuit carrier made of a non-metal material and deviating from a plate shape, to which metal conductor tracks (80) are applied; wherein the housing (20) has an opening (26) which is arranged at an outer circumference thereof and below which the sensor device (84) of the electrical circuit is placed.

\* \* \* \* \*